(12) United States Patent
Tanaka et al.

(10) Patent No.: US 10,367,103 B2
(45) Date of Patent: Jul. 30, 2019

(54) PHOTOELECTRIC CONVERSION ELEMENT

(71) Applicants: Yuuji Tanaka, Shizuoka (JP); Shigeyo Suzuki, Shizuoka (JP); Naomichi Kanei, Shizuoka (JP)

(72) Inventors: Yuuji Tanaka, Shizuoka (JP); Shigeyo Suzuki, Shizuoka (JP); Naomichi Kanei, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/730,815

(22) Filed: Oct. 12, 2017

(65) Prior Publication Data

US 2018/0053863 A1 Feb. 22, 2018

Related U.S. Application Data

(63) Continuation of application No. PCT/JP2016/063685, filed on May 6, 2016.

(30) Foreign Application Priority Data

May 8, 2015 (JP) ................................ 2015-095777

(51) Int. Cl.
*H01L 31/044* (2014.01)
*H01L 31/0224* (2006.01)
(Continued)

(52) U.S. Cl.
CPC ...... *H01L 31/022425* (2013.01); *H01L 27/30* (2013.01); *H01L 27/301* (2013.01);
(Continued)

(58) Field of Classification Search
CPC .................. H01L 31/00–078; Y02E 10/50–60
(Continued)

(56) References Cited

U.S. PATENT DOCUMENTS

| 6,084,176 A | 7/2000 | Shiratsuchi et al. |
| 2012/0090679 A1* | 4/2012 | Chittibabu .......... H01L 51/4226 136/256 |

(Continued)

FOREIGN PATENT DOCUMENTS

| JP | 11-144773 | 5/1999 |
| JP | 2000-106223 | 4/2000 |

(Continued)

OTHER PUBLICATIONS

Kusama et al. Influence of Alkylaminopyridine Additives in Electrolytes on Dye-sensitized Solar Cell Performance. Solar Energy Materials & Solar Cells, 81, 2004, 87-99 (Year: 2004).*

(Continued)

*Primary Examiner* — Bach T Dinh
(74) *Attorney, Agent, or Firm* — Oblon, McClelland, Maier & Neustadt, L.L.P.

(57) ABSTRACT

Provided is a photoelectric conversion element including: a first electrode having opaqueness to light and formed of a metal; a hole blocking layer provided on the first electrode; an electron transport layer provided on the hole blocking layer; a hole transport layer provided on the electron transport layer; and a second electrode provided on the hole transport layer and having transmissivity to light, wherein the hole blocking layer contains an oxide of the metal in the first electrode.

10 Claims, 1 Drawing Sheet

(51) Int. Cl.
*H01L 27/30* (2006.01)
*H01L 51/44* (2006.01)
*H01L 51/42* (2006.01)

(52) U.S. Cl.
CPC .......... *H01L 51/441* (2013.01); *H01L 51/442* (2013.01); *H01L 51/4226* (2013.01); *Y02E 10/549* (2013.01)

(58) Field of Classification Search
USPC ................................................ 136/243–265
See application file for complete search history.

(56) References Cited

U.S. PATENT DOCUMENTS

| | | | |
|---|---|---|---|
| 2013/0040516 A1 | 2/2013 | Pruneri et al. | |
| 2014/0102540 A1* | 4/2014 | Kobayashi | C09B 23/0091 136/263 |
| 2014/0212705 A1 | 7/2014 | Horiuchi et al. | |
| 2015/0129034 A1* | 5/2015 | Snaith | H01L 51/4213 136/258 |

FOREIGN PATENT DOCUMENTS

| | | |
|---|---|---|
| JP | 2009-252726 | 10/2009 |
| JP | 2012-521092 | 9/2012 |
| JP | 2014-143333 | 8/2014 |
| WO | WO 2011/101338 A2 | 8/2011 |
| WO | WO 2015/125587 A1 | 8/2015 |

OTHER PUBLICATIONS

Extended European Search Report dated Apr. 26, 2018 in European Patent Application No. 16792636.9, 6 pages.
International Search Report dated Jul. 12, 2016 for counterpart International Patent Application No. PCT/JP2016/063685 filed May 6, 2016 (with English Translation).
Written Opinion dated Jul. 12, 2016 for counterpart International Patent Application No. PCT/JP2016/063685 filed May 6, 2016.
Takashi Sekiguchi, et al., "Improvement of Durability of Dye-Sensitized Solar Cells for Indoor Applications," Panasonic Technical Report, vol. 56, No. 4 (2008) 7 Pages (with partial English Translation).
K. Tennakone, et al., "A dye-sensitized nano-porous solid-state photovoltaic cell," Semicond. Sci. Technol., 10 (1995) 6 pages.
Jurgen Hagen, et al., "Novel hybrid solar cells consisting of inorganic nanoparticles and an organic hole transport material," Synthetic Metals, 89 (1997) 215-220.
U. Bach, et al., "Solid-state dye-sensitized mesoporous TiO2 solar cells with high photon-to-electron conversion efficiencies," Letter to Nature, 398 (1998) 583-585.
Kei Murakoshi, et al., "Solid State Dye-Sensitized TiO2 Solar Cell with Polypyrrole as Hole Transport Layer," Chemistry Letters, (1997) 471-472.
Onoda Kinji et al., The superiority of Ti plate as the substrate of dye-sensitized solar cells, Solar Energy Materials and Solar Cells, 2007, 91, 13, p. 1176-1181.
Ito Seigo et al., High-efficiency(7.2%) flexible dye-sensitized solar cells with Ti-metal substrate for nanocrystalline-$TiO_2$ photoanode, Chemical Communications, 2006, p. 4004-4006.

* cited by examiner

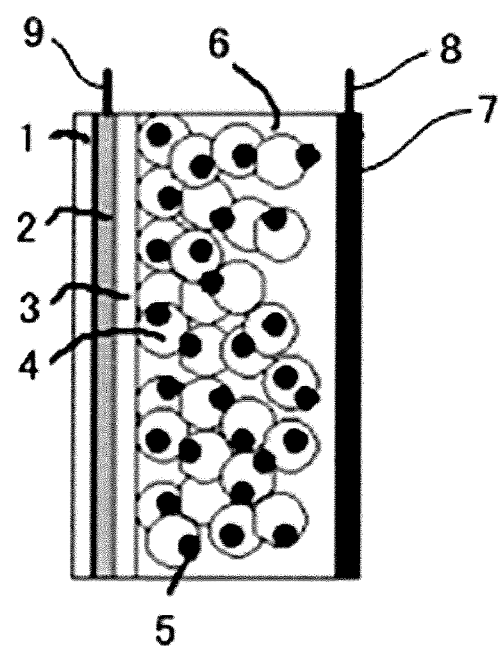

PHOTOELECTRIC CONVERSION ELEMENT

CROSS-REFERENCE TO RELATED APPLICATIONS

The present application is a continuation application of International Application No. PCT/JP2016/063685, filed May 6, 2016, which claims priority to Japanese Patent Application No. 2015-095777, filed May 8, 2015. The contents of these applications are incorporated herein by reference in their entirety.

BACKGROUND OF THE INVENTION

Field of the Invention

The present disclosure relates to a photoelectric conversion element.

Description of the Related Art

In recent years, driving power for electronic circuits has been significantly reduced, and it has become possible to drive various electronic parts such as sensors with a weak power (of a microwatt order). Expected uses of sensors include application to stand-alone power systems (energy harvesting elements) capable of generating and consuming power instantly. Among such energy harvesting elements, solar cells (which are a kind of photoelectric conversion elements) are drawing attention as elements capable of generating power at anywhere there is light. Small-sized energy harvesting elements can be disposed at various places, and when combined with secondary cells, can serve as primary cells that need no replacement. Improvement in the power generation performance will enable a greater downsizing and an increase in the number of times sensor information can be transmitted wirelessly.

Among the solar cells, dye-sensitized solar cells proposed by Graetzel et al. from Swiss Federal Institute of Technology in Lausanne have been reported to have high photoelectric conversion characteristics greater than or equal to photoelectric conversion characteristics of amorphous silicon solar cells in environments under weak room light (see Panasonic Technical Report, Vol. 56, No. 4 (2008) 87). Room light of, for example, LED lights and fluorescent lamps typically has illuminance of about from 200 Lux through 1,000 Lux, and is light by far weaker than direct sunlight (about 100,000 Lux). In many cases, the energy harvesting elements are installed on, for example, walls, but not directly under the room light. In this case, light radiated to the energy harvesting elements becomes even weaker light. Walls in offices are at about 300 Lux, and walls in work rooms are at about 500 Lux. Hence, a high photoelectric conversion efficiency is desired even in environments under weak light such as room light.

Meanwhile, existing dye-sensitized solar cells using electrolytic solutions are at a risk of, for example, volatilization or leak of the electrolytic solutions. Therefore, for practical use, it is desired to provide the electrolytic solutions in the form of solids. For example, many reports have been made on solid dye-sensitized solar cells as presented below.

(1) Solid dye-sensitized solar cells using inorganic semi-conductors (see, for example, Semicond. Sci. Technol., 10 (1995) 1689)

(2) Solid dye-sensitized solar cells using low-molecular-weight organic hole transport materials (see, for example, Japanese Unexamined Patent Application Publication No. 11-144773, Synthetic Metals, 89 (1997) 215, and Nature, 398 (1998) 583)

(3) Solid dye-sensitized solar cells using conductive polymers (see, for example, Japanese Unexamined Patent Application Publication No. 2000-106223 and Chem. Lett., (1997) 471)

However, reports that have been made so far on solid dye-sensitized solar cells are merely reports on photoelectric conversion efficiencies under artificial sunlight, but not on reports on photoelectric conversion efficiencies under, for example, room light. Especially, photoelectric conversion efficiencies in environments under weak light (from 50 Lux through 300 Lux) have not been reported at all.

SUMMARY OF THE INVENTION

According to one aspect of the present disclosure, a photoelectric conversion element includes a first electrode having opaqueness to light and formed of a metal, a hole blocking layer provided on the first electrode, an electron transport layer provided on the hole blocking layer, a hole transport layer provided on the electron transport layer, and a second electrode provided on the hole transport layer and having transmissivity to light. The hole blocking layer contains an oxide of the metal in the first electrode.

BRIEF DESCRIPTION OF THE DRAWINGS

FIG. 1 is a schematic view illustrating an example of a photoelectric conversion element of the present disclosure.

DESCRIPTION OF THE EMBODIMENTS

The present disclosure has an object to provide a photoelectric conversion element having a high photoelectric conversion efficiency even under weak irradiation light (from 50 Lux through 300 Lux) such as room light.

The present disclosure can provide a photoelectric conversion element having a high photoelectric conversion efficiency even under weak irradiation light (from 50 Lux through 300 Lux) such as room light.

(Photoelectric Conversion Element)

A photoelectric conversion element of the present disclosure includes a first electrode having opaqueness to light and formed of a metal, a hole blocking layer provided on the first electrode, an electron transport layer provided on the hole blocking layer, a hole transport layer provided on the electron transport layer, and a second electrode provided on the hole transport layer and having transmissivity to light. The photoelectric conversion element further includes other layers as needed.

<First Electrode>

The first electrode is not particularly limited and may be appropriately selected depending on the intended purpose, so long as the first electrode has non-transmissivity (opaqueness) to visible light and is formed of a metal.

The opaqueness to light means that transmittance of visible light is lower than 50%.

The transmittance of visible light can be measured with, for example, an ultraviolet-visible (UV-vis) spectroscopy method.

Examples of the material of the first electrode include silver, stainless steel, copper, titanium, and aluminium. One of these materials may be used alone or two or more of these materials may be used in combination. Among these materials, titanium is preferable.

The average thickness of the first electrode is preferably 100 nm or greater, more preferably 1 micrometer or greater, and yet more preferably 50 micrometers or greater.

In order for the first electrode to maintain a predetermined hardness, it is preferable to provide the first electrode on a substrate when the average thickness of the first electrode is 1 micrometer or less. Examples of the substrate include a glass plate, a transparent plastic plate, a transparent plastic film, and an inorganic transparent crystal. When the average thickness of the first electrode is about 50 micrometers, the first electrode can maintain hardness, and hence does not need a substrate.

<Hole Blocking Layer>

The hole blocking layer is provided in order to suppress a fall in electric power due to contact of an electrolyte with an electrode and consequent recombination between holes in the electrolyte and electrons in a surface of the electrode (so-called back electron transfer). The hole blocking layer is formed also for the purpose of preventing an electronic contact between the first electrode and the hole transport layer.

The effect of the hole blocking layer is particularly remarkable in solid dye-sensitized solar cells. This is because a speed of recombination (back electron transfer) between holes in hole transport materials and electrons in surfaces of electrodes is higher in solid dye-sensitized solar cells using, for example, organic hole transport materials than in wet dye-sensitized solar cells using electrolytic solutions.

The hole blocking layer contains an oxide of the metal in the first electrode.

The material of the hole blocking layer is not particularly limited and may be appropriately selected depending on the intended purpose so long as the material is an oxide of the metal in the first electrode and is transparent (transmissive) to visible light. Examples of the material of the hole blocking layer includes titanium oxide, copper oxide, and aluminium oxide. Among these materials, titanium oxide is preferable.

The method for producing the hole blocking layer is not particularly limited and may be appropriately selected depending on the intended purpose. In order to suppress loss current under room light, a high internal resistance is needed, and a film forming method is important.

Examples of typical methods for producing the hole blocking layer include a sol-gel method, which is wet film formation, which however results in a low film density to make it impossible to suppress loss current sufficiently. Hence, dry film formation such as a sputtering method is preferable and can provide a sufficiently high film density to make it possible to suppress loss current.

As the sputtering method, a reactive sputtering method by an oxygen gas using a target formed of a metal is preferable.

When the first electrode is heated in an oxygen atmosphere at from 700 degrees C. through 1,100 degrees C., the metal in the surface of the first electrode is reformed to a metal oxide. This makes it possible to coat the surface of the first electrode with a metal oxide film. The metal oxide film is more excellent in the characteristic of interface bonding with the first electrode and can hence improve the characteristic of electron injection into the first electrode needed.

The average thickness of the hole blocking layer is not particularly limited, may be appropriately selected depending on the intended purpose, and is preferably 10 nm or greater but 1 micrometer or less.

<Electron Transport Layer>

The electron transport layer is a porous layer provided on the hole blocking layer, and may contain a single layer or multiple layers.

In the case of multiple layers, it is possible to form multiple layers by coating dispersion liquids of semiconductor particles having different particle diameters, or it is also possible to form multiple layers by coating different kinds of semiconductors or different resin or additive compositions.

When a sufficient film thickness is not obtained with one coating, coating of multiple layers is an effective means.

Typically, an amount of a photosensitizing compound supported by the electron transport layer per a unit projected area increases as a thickness of the electron transport layer is increased, leading to an increase in a light capture rate. However, this also increases a distance to which injected electrons diffuse, to increase loss due to recombination of charges.

Hence, the average thickness of the electron transport layer is preferably 100 nm or greater but 100 micrometers or less.

The semiconductor particles are not particularly limited and may be appropriately selected depending on the intended purpose. Examples of the semiconductor particles include element semiconductors such as silicon and germanium, compound semiconductors represented by chalcogenides of metals, and compounds having a perovskite structure. One of these kinds of semiconductor particles may be used alone or two or more of these kinds of semiconductor particles may be used in combination.

Examples of the chalcogenides of metals include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium.

Examples of the compound semiconductors include: phosphides of, for example, zinc, gallium, indium, and cadmium; gallium arsenide; copper-indium-selenide; and copper-indium-sulfide.

Examples of the compounds having a perovskite structure include strontium titanate, calcium titanate, sodium titanate, barium titanate, and potassium niobate.

Among these semiconductor particles, oxide semiconductors are preferable, and titanium oxide, zinc oxide, tin oxide, and niobium oxide are more preferable.

A crystal form of the semiconductor is not particularly limited, may be appropriately selected depending on the intended purpose, and may be monocrystalline, polycrystalline, or amorphous.

The size of the semiconductor particles is not particularly limited and may be appropriately selected depending on the intended purpose. The average particle diameter of the primary particles of the semiconductor particles is preferably 1 nm or greater but 100 nm or less and more preferably 5 nm or greater but 50 nm or less.

It is also possible to improve photoelectric conversion efficiency based on an incident-light-scattering effect obtained by mixing or laminating semiconductor particles having a greater average particle diameter.

The average particle diameter of the semiconductor particles is preferably 50 nm or greater but 500 nm or less.

A method for producing the electron transport layer is not particularly limited and may be appropriately selected depending on the intended purpose. Examples of the method include a method for forming a thin film in vacuum, such as sputtering, and a wet film forming method. When production costs and other factors are taken into consideration, among these methods, the wet film forming method is preferable, and a method of preparing a paste in which powder or sol of the semiconductor particles is dispersed, and coating a substrate with the paste is more preferable.

In using the wet film forming method, a coating method is not particularly limited and may be performed according to a known method. For example, examples of the known method include a dipping method, a spraying method, a wire bar method, a spin coating method, a roller coating method, a blade coating method, and a gravure coating method. Moreover, as wet printing methods, various methods such as letterpress, offset, gravure, intaglio, rubber plate, and screen printing may be used.

In producing a dispersion liquid of the semiconductor particles by mechanical pulverization or using a mill, it is possible to form the dispersion liquid by dispersing at least semiconductor particles alone or a mixture of semiconductor particles and a resin in water or an organic solvent.

The resin is not particularly limited and may be appropriately selected depending on the intended purpose. Examples of the resin include polymers or copolymers of vinyl compounds based on, for example, styrene, vinyl acetate, acrylic ester, and methacrylic ester, silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyallylate resins, polyamide resins, and polyimide resins. One of these resins may be used alone or two or more of these resins may be used in combination.

The solvent in which the semiconductor particles are dispersed is not particularly limited and may be appropriately selected depending on the intended purpose. Examples of the solvent include: water; alcohol-based solvents; ketone-based solvents; ester-based solvents; ether-based solvents; amide-based solvents; halogenated hydrocarbon-based solvents; and hydrocarbon-based solvents. One of these solvents may be used alone or two or more of these solvents may be used in combination.

Examples of the alcohol-based solvents include methanol, ethanol, isopropyl alcohol, and caerpineol.

Examples of the ketone-based solvents include acetone, methyl ethyl ketone, and methyl isobutyl ketone.

Examples of the ester-based solvents include ethyl formate, ethyl acetate, and n-butyl acetate.

Examples of the ether-based solvents include diethyl ether, dimethoxyethane, tetrahydrofuran, dioxolane, and dioxane.

Examples of the amide-based solvents include N,N-dimethylformamide, N,N-dimethylacetamide, and N-methyl-2-pyrrolidone.

Examples of the halogenated hydrocarbon-based solvents include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon-based solvents include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

For prevention of reaggregation of particles, for example, an acid such as hydrochloric acid, nitric acid, and acetic acid, a surfactant such as polyoxyethylene (10) octylphenyl ether, and a chelate agent such as acetylacetone, 2-aminoethanol, and ethylene diamine may be added to the dispersion liquid of the semiconductor particles or to the paste of the semiconductor particles obtained by, for example, a sol-gel method.

Furthermore, adding a thickener with a view to improving a film forming property is an effective means.

Examples of the thickener include polyethylene glycols, polyvinyl alcohols, and ethyl cellulose.

It is preferable to subject the semiconductor particles after coated to firing, microwave irradiation, electron beam irradiation, or laser light irradiation in order to provide an electronic contact between the particles, improve a film strength, and improve close adhesiveness with the substrate. One of these treatments may be applied alone or two or more kinds of these treatments may be applied in combination.

In the firing, a firing temperature is not limited to a particular range and may be appropriately selected depending on the intended purpose. However, the firing temperature is preferably 30 degrees C. or higher but 700 degrees C. or lower and more preferably 100 degrees C. or higher but 600 degrees C. or lower because the resistance of the substrate may become high or the substrate may melt if the temperature is excessively high. A firing time is also not particularly limited, may be appropriately selected depending on the intended purpose, and is preferably 10 minutes or longer but 10 hours or shorter.

The microwave irradiation may be given from a side at which the electron transport layer is formed or from a back side.

An irradiation time is not particularly limited, may be appropriately selected depending on the intended purpose, and is preferably within 1 hour.

After firing, chemical plating using an aqueous solution of titanium tetrachloride or a mixture solution of titanium tetrachloride with an organic solvent or an electrochemical plating treatment using a titanium trichloride aqueous solution may be performed with a view to increasing a surface area of the semiconductor particles and increasing efficiency of electron injection from a photosensitizing compound into the semiconductor particles.

A porous state is formed in the film obtained by depositing the semiconductor particles having a diameter of several tens of nanometers by, for example, sintering. This nanoporous structure has an extremely large surface area. The surface area can be expressed by a roughness factor.

The roughness factor is a value representing an actual area inside the porous texture relative to an area of the semiconductor particles coated on the substrate. Hence, a greater roughness factor is more preferable. However, considering the relationship with the thickness of the electron transport layer, the roughness factor is preferably 20 or greater.

—Photosensitizing Compound—

In the present disclosure, in order to further improve the conversion efficiency, a photosensitizing compound is adsorbed to the surface of the electron transport semiconductor serving as the electron transport layer.

The photosensitizing compound is not particularly limited and may be appropriately selected depending on the intended purpose so long as the photosensitizing compound is a compound optically excitable by excitation light used. Examples of the photosensitizing compound include: metal complex compounds described in, e.g., Japanese Translation of PCT International Application Publication No. JP-T-07-500630, and Japanese Unexamined Patent Application Publication Nos. 10-233238, 2000-26487, 2000-323191, and 2001-59062; coumarin compounds described in, e.g., Japanese Unexamined Patent Application Publication Nos. 10-93118, 2002-164089 and 2004-95450, and J. Phys. Chem. C, 7224, Vol. 111 (2007); polyene compounds described in, e.g., Japanese Unexamined Patent Application Publication No. 2004-95450 and Chem. Commun., 4887 (2007); indoline compounds described in, e.g., Japanese Unexamined Patent Application Publication Nos. 2003-

264010, 2004-63274, 2004-115636, 2004-200068, and 2004-235052, J. Am. Chem. Soc., 12218, Vol. 126 (2004), Chem. Commun., 3036 (2003), and Angew. Chem. Int. Ed., 1923, Vol. 47 (2008); thiophene compounds described in, e.g., J. Am. Chem. Soc., 16701, Vol. 128 (2006) and J. Am. Chem. Soc., 14256, Vol. 128 (2006); cyanine dyes described in, e.g., Japanese Unexamined Patent Application Publication Nos. 11-86916, 11-214730, 2000-106224, 2001-76773, and 2003-7359; merocyanine dyes described in, e.g., Japanese Unexamined Patent Application Publication Nos. 11-214731, 11-238905, 2001-52766, 2001-76775, and 2003-7360; 9-arylxanthene compounds described in, e.g., Japanese Unexamined Patent Application Publication Nos. 10-92477, 11-273754, 11-273755, and 2003-31273; triarylmethane compounds described in, e.g., Japanese Unexamined Patent Application Publication Nos. 10-93118 and 2003-31273; and phthalocyanine compounds and porphyrin compounds described in, e.g., Japanese Unexamined Patent Application Publication Nos. 09-199744, 10-233238, 11-204821 and 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008). One of these photosensitizing compounds may be used alone or two or more of these photosensitizing compounds may be used in combination. Among these photosensitizing compounds, metal complex compounds, coumarin compounds, polyene compounds, indoline compounds, and thiophene compounds are preferable.

Preferable examples of the photosensitizing compound include D131 represented by structural formula (2) below and available from Mitsubishi Paper Mills Limited and D102 represented by structural formula (3) below and available from Mitsubishi Paper Mills Limited.

<Structural formula (2): D131>

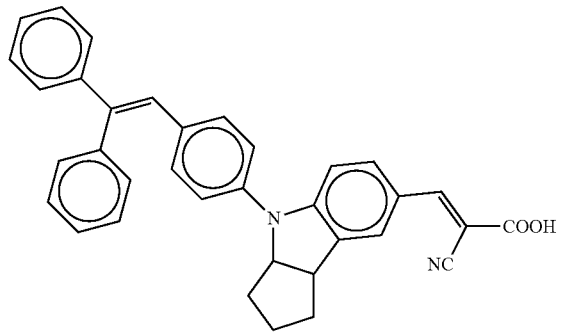

<Structural formula (3): D102>

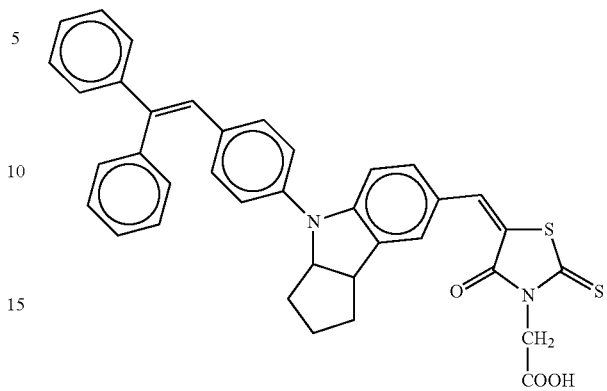

A compound represented by general formula (2) below is also preferable as the photosensitizing compound.

<General formula (2)>

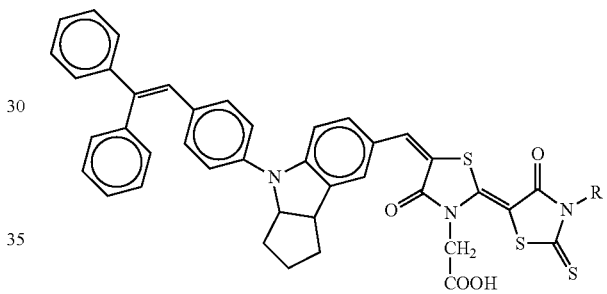

In general formula (2), R represents a substituted or unsubstituted alkyl group.

It is preferable that R in general formula (2) be an alkyl group or a carboxylic acid group-substituted alkyl group.

Examples of specific exemplary compounds of general formula (2) include, but are not limited to, D358 represented by structural formula (4) below and available from Mitsubishi Paper Mills Limited.

<Structural formula (4): D358>

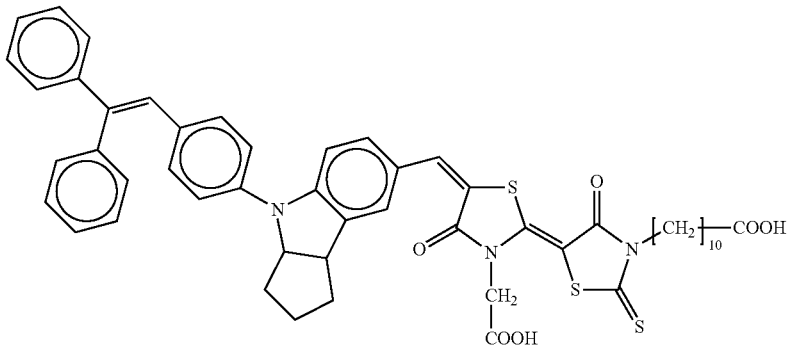

Examples of a method for adsorbing the photosensitizing compound to the electron transport layer include a method of immersing an electron collecting electrode including the semiconductor particles in a solution or dispersion liquid of the photosensitizing compound, and a method of coating the electron transport layer with the solution or the dispersion liquid of the photosensitizing compound to adsorb the photosensitizing compound.

In the case of the method of immersing an electron collecting electrode including the semiconductor particles in a solution or dispersion liquid of the photosensitizing compound, for example, an immersing method, a dipping method, a roller method, and an air knife method may be used.

In the case of the method of coating the electron transport layer with the solution or the dispersion liquid of the photosensitizing compound to adsorb the photosensitizing compound, for example, a wire bar method, a slide hopper method, an extrusion method, a curtain method, a spinning method, and a spraying method may be used.

The photosensitizing compound may be adsorbed under a supercritical fluid of, for example, carbon dioxide.

In adsorbing the photosensitizing compound, a condensing agent may be used in combination.

The condensing agent may be any of: a substance that is assumed to catalyze physical or chemical binding of the photosensitizing compound and the electron transport compound with a surface of an inorganic substance; and a substance that acts stoichiometrically to cause a chemical equilibrium to move in an advantageous manner.

Furthermore, thiol or a hydroxy compound may be added as a condensing aid.

A solvent in which the photosensitizing compound is dissolved or dispersed is not particularly limited and may be appropriately selected depending on the intended purpose. Examples of the solvent include water, alcohol-based solvents, ketone-based solvents, ester-based solvents, ether-based solvents, amide-based solvents, halogenated hydrocarbon-based solvents, and hydrocarbon-based solvents. One of these solvents may be used alone or two or more of these solvents may be used in combination.

Examples of the alcohol-based solvents include methanol, ethanol, and isopropyl alcohol.

Examples of the ketone-based solvents include acetone, methyl ethyl ketone, and methyl isobutyl ketone.

Examples of the ester-based solvents include ethyl formate, ethyl acetate, and n-butyl acetate.

Examples of the ether-based solvents include diethyl ether, dimethoxyethane, tetrahydrofuran, dioxolane, and dioxane.

Examples of the amide-based solvents include N,N-dimethylformamide, N,N-dimethylacetamide, and N-methyl-2-pyrrolidone.

Examples of the halogenated hydrocarbon-based solvents include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon-based solvents include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

Some kinds of photosensitizing compounds act more effectively when aggregation of the compound is suppressed. Hence, a deaggregating agent may be used in combination.

The deaggregating agent is not particularly limited depending on the dye to be used and may be appropriately selected depending on the intended purpose. Preferable examples of the deaggregating agent include steroid compounds such as cholic acid and chenodeoxycholic acid, long-chain alkylcarboxylic acids, or long-chain alkylphosphonic acids.

The content of the deaggregating agent is preferably 0.01 parts by mass or greater but 500 parts by mass or less and more preferably 0.1 parts by mass or greater but 100 parts by mass or less relative to 1 part by mass of the dye.

The temperature for adsorbing the photosensitizing compound or the photosensitizing compound and the deaggregating agent is preferably −50 degrees C. or higher but 200 degrees C. or lower.

The adsorption may be performed in a still state or under stirring.

A method for the stirring is not particularly limited and may be appropriately selected depending on the intended purpose. Examples of the method include a stirrer, a ball mill, a paint conditioner, a sand mill, an attritor, a disperser, and ultrasonic dispersion.

A time needed for the adsorption is preferably 5 seconds or longer but 1,000 hours or shorter, more preferably 10 seconds or longer but 500 hours or shorter, and yet more preferably 1 minute or longer but 150 hours.

It is preferable to perform the adsorption in a dark place.

<Hole Transport Layer>

The hole transport layer contains a hole transport material, preferably contains a basic compound and lithium bis(trifluoromethanesulfonyl)imide, and further contains other components as needed.

The hole transport layer may have a single-layer structure or a laminated structure formed of different compounds. In the case of the laminated structure, it is preferable to use a polymer as a hole transport material in the hole transport layer near the second electrode. This is because use of a polymer having an excellent film forming property can make the surface of the porous electron transport layer smoother and can improve the photoelectric conversion characteristic.

Furthermore, it is difficult for a polymer to permeate the inside of the porous electron transport layer. This in turns makes the polymer excellent in coating the surface of the porous electron transport layer and effective for preventing short circuiting when an electrode is provided, leading to a higher performance.

—Hole Transport Material—

A hole transport material used in a single-layer structure is not particularly limited and may be appropriately selected depending on the intended purpose. Examples of the hole transport material include: oxadiazole compounds presented in, e.g., Japanese Examined Patent Publication No. 34-5466; triphenylmethane compounds presented in, e.g., Japanese Examined Patent Publication No. 45-555; pyrazoline compounds presented in, e.g., Japanese Examined Patent Publication No. 52-4188; hydrazone compounds presented in, e.g., Japanese Examined Patent Publication No. 55-42380; oxadiazole compounds presented in, e.g., Japanese Unexamined Patent Application Publication No. 56-123544; tetraarylbenzidine compounds presented in Japanese Unexamined Patent Application Publication No. 54-58445; and stilbene compounds presented in Japanese Unexamined Patent Application Publication No. 58-65440 or Japanese Unexamined Patent Application Publication No. 60-98437. One of these hole transport materials may be used alone or two or more of these hole transport materials may be used in combination.

Among these hole transport materials, a hole transport material (2,2',7,7'-tetrakis(N,N-di-p-methoxyphenylamino)-9,9'-spirobifluorene: spiro-OMeTAD) described in "J. Am. Chem. Soc., 133 (2011) 18042" and a hole transport material (2,2',7,7'-tetrakis(N,N-di-p-methoxyphenylamino)-9,9'-spirobifluorene) described in "J. Am. Chem. Soc., 135 (2013) 7378" are preferable in terms of photoelectric conversion efficiency. Spiro-OMeTAD is particularly preferable. The spiro-OMeTAD is represented by structural formula (1) below.

<Structural formula (1)>

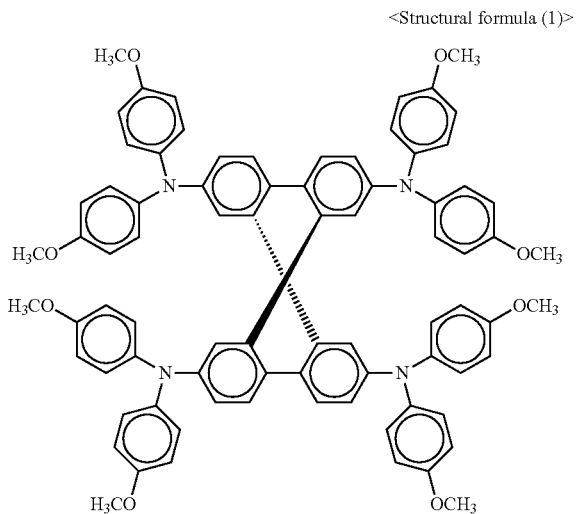

The spiro-OMeTAD has a high Hall mobility and includes two benzidine skeleton molecules that are bound with each other in a twisted state. Hence, the spiro-OMeTAD forms an electron cloud close to a spherical shape and has a good hopping conductivity between the molecules, leading to a more excellent photoelectric conversion characteristic. The spiro-OMeTAD also has a high solubility, is soluble in various organic solvents, and is amorphous (i.e., an amorphous substance having no crystalline structure). Therefore, the spiro-OMeTAD is likely to be densely filled in the porous electron transport layer and has properties useful for a solid dye-sensitized solar cell. Moreover, the spiro-OMeTAD does not have a light absorbing property at 450 nm or longer. Therefore, the spiro-OMeTAD can enable light to be efficiently absorbed into the photosensitizing compound, and has a property useful for a solid dye-sensitized solar cell. A thickness of the hole transport layer formed of the spiro-OMeTAD is not limited. It is preferable that the hole transport layer have a structure of intruding into voids of the porous electron transport layer, and it is preferable that the hole transport layer have a thickness of preferably 0.01 micrometers or greater and more preferably 0.1 micrometers or greater but 10 micrometers or less on the electron transport layer.

A known hole transportable polymer is used as the polymer to be used near the second electrode in the hole transport layer used in the form of the laminated structure.

Examples of the hole transportable polymer include polythiophene compounds, polyphenylenevinylene compounds, polyfluorene compounds, polyphenylene compounds, polyarylamine compounds, and polythiadiazole compounds. One of these hole transportable polymers may be used alone or two or more of these hole transportable polymers may be used in combination.

Examples of the polythiophene compounds include poly(3-n-hexylthiophene), poly(3-n-octyloxythiophene), poly(9,9'-dioctyl-fluorene-co-bithiophene), poly(3,3'-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene).

Examples of the polyphenylenevinylene compounds include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylphexyloxy)-1,4-phenylenevinylene)-co-(4,4'-biphenylene-vinylene)].

Examples of the polyfluorene compounds include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compounds include poly[2,5-dioctyloxy-1,4-phenylene] and poly[2,5-di(2-ethylhexyloxy-1,4-phenylene].

Examples of the polyarylamine compounds include poly[(9,9-dioctylfluorenyl-2,7-diyl)-alt-co-(N,N'-diphenyl)-N,N-di(p-hexylphenyl)-1,4-diaminobenzene], poly[(9,9-dioctylfluorenyl-2,7-diyl)-alt-co-(N,N-bis(4-octyloxyphenyn-benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylen], poly[p-tolylimino-1,4-phenylenevinylene-2,5-di(2-ethylhexyloxy)-1,4-phenylenevinylene-1,4-phenylen], and poly[4-(2-ethylhexyloxy)phenylimino-1,4-biphenylen].

Examples of the polythiadiazole compounds include poly[(9,9-dioctylfluorenyl-2,7-diyl)-alt-co-(1,4-benzo(2,1',3) thiadiazole] and poly(3,4-didecylthiophene-co-(1,4-benzo (2,1',3)thiadiazole).

Among these hole transportable polymers, the polythiophene compounds and the polyarylamine compounds are particularly preferable in terms of carrier mobility and ionization potential.

With a view to improving conductivity, an oxidizing agent for changing part of the hole transport material to a radical cation may be added.

Examples of the oxidizing agent include tris(4-bromophenyl)aminium hexachloroantimonate, silver hexafluoroantimonate, nitrosonium tetrafluoroborate, silver nitrate, and cobalt complex-based compounds.

There is no need that the whole of the organic hole transport material be oxidized by addition of the oxidizing agent. Only part of the organic hole transport material needs to be oxidized. It is optional whether the added oxidizing agent is removed or not to the outside of the system after addition.

—Basic Compound—

By the hole transport layer containing a basic compound represented by general formula (1) below, a high open circuit voltage can be obtained. Furthermore, an internal resistance in the photoelectric conversion element rises to enable reduction of loss current under weak light such as room light. Hence, it is possible to obtain an open circuit voltage higher than obtained with an existing basic compound.

<General formula (1)>

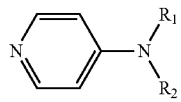

In general formula (1), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom.

Hitherto, basic compounds of general formula (1) such as compounds Nos. 2-1 and 2-3 have been known to be used as basic compounds in iodine electrolytic solution-type dye-sensitized solar cells. These compounds have been reported to provide a high open circuit voltage, but to significantly reduce a short-circuiting current density and considerably worsen a photoelectric conversion characteristic.

The hole transport layer uses the hole transport material and is different from a hole transport model based on, for example, the iodine electrolytic solution. Hence, reduction of a short-circuiting current density is low and a high open circuit voltage can be obtained, to make it possible to obtain an excellent photoelectric conversion characteristic. Furthermore, it was possible to verify that a particularly outstanding excellent performance was exhibited in photoelectric conversion under weak light such as room light. This photoelectric conversion is a scarcely reported case.

Specific exemplary compounds of general formula (1) will be presented below. However, these compounds are non-limiting examples. Note that "Nikkaji No." presented below indicates a number in Japan Chemical Substance Dictionary and is based on an organic compound database administered by Japan Science and Technology Agency.

<Compound No. 2-1, Nikkaji No. J31.394G>

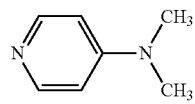

<Compound No. 2-2, Nikkaji No. J2.748.250C>

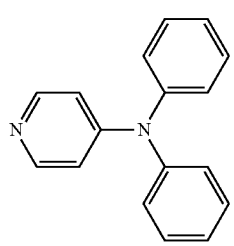

<Compound No. 2-3, Nikkaji No. J174K>

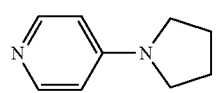

<Compound No. 2-4, Nikkaji No. J880.4591>

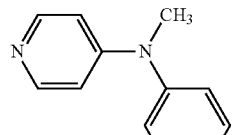

<Compound No. 2-5, Nikkaji No. J1.983.963J>

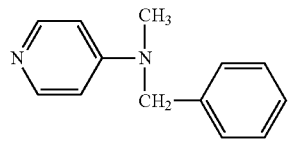

—Method for Synthesizing Basic Compound Represented by General Formula (1)—

As a method for synthesizing the basic compound represented by general formula (1), there is the following easy synthesizing route, which is reported in "J. Org. Chem., 67 (2002) 3029".

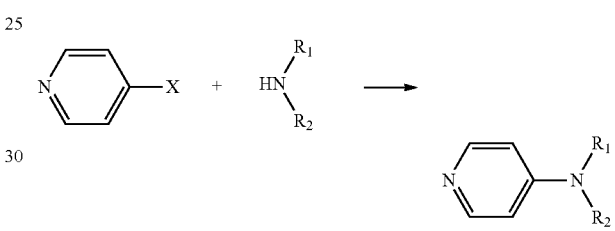

In general formula (1), $R_1$ and $R_2$ represent a substituted or unsubstituted alkyl group or aromatic hydrocarbon group and may be identical or different. $R_1$ and $R_2$ may bind with each other to form a substituted or unsubstituted heterocyclic group containing a nitrogen atom. X represents a halogen.

The amount of the basic compound represented by general formula (1) to be added in the hole transport layer is preferably 1 part by mass or greater but 30 parts by mass or less and more preferably 10 parts by mass or greater but 20 parts by mass or less relative to 100 parts by mass of the hole transport material.

By the basic compound represented by general formula (1) being contained, an internal resistance in the photoelectric conversion element becomes even higher, to enable reduction of loss current under weak light (from 50 Lux through 300 Lux) such as room light.

The hole transport layer can contain a lithium compound such as lithium bis(trifluoromethanesulfonyl)imide, lithium trifluoromethane sulfonylimide, and lithium diisopropylimide. Among these lithium compounds, lithium bis(trifluoromethanesulfonyl)imide is preferable.

—Other Components—

The other components are not particularly limited and may be appropriately selected depending on the intended purpose. Examples of the other components include metal iodides, iodine salts of quaternary ammonium compounds, metal bromides, bromine salts of quaternary ammonium compounds, metal chlorides, metal acetates, metal sulfates, metal complexes, sulfur compounds, ionic liquids described in Inorg. Chem. 35 (1996) 1168, basic compounds, and 1-n-hexyl-3-methyl imidazolinium bis(trifluoromethylsulfonyl)imide.

Examples of the metal iodides include iodine, lithium iodide, sodium iodide, potassium iodide, cesium iodide, calcium iodide, copper iodide, iron iodide, and silver iodide.

Examples of the iodine salts of quaternary ammonium compounds include tetraalkylammonium iodide and pyridinium iodide.

Examples of the metal bromides include lithium bromide, sodium bromide, potassium bromide, cesium bromide, and calcium bromide.

Examples of the bromine salts of quaternary ammonium compounds include tetraalkylammonium bromide and pyridinium bromide.

Examples of the metal chlorides include copper chloride and silver chloride.

Examples of the metal acetates include copper acetate, silver acetate, and palladium acetate.

Examples of the metal sulfates include copper sulfate and zinc sulfate.

Examples of the metal complexes include ferrocyanate-ferricyanate and ferrocene-ferricinium ion.

Examples of the sulfur compounds include polysodium sulfide and alkyl thiol-alkyl disulfide.

Examples of the ionic liquids described in Inorg. Chem. 35 (1996) 1168 include viologen dyes, hydroquinone, etc., 1,2-dimethyl-3-n-propylimidazolinium iodide, 1-methyl-3-n-hexylimidazolinium iodide, 1,2-dimethyl-3-ethylimidazoliumtrifluoromethane sulfonic acid salt, 1-methyl-3-butyl-imidazoliumnonafluorobutyl sulfonic acid salt, and 1-methyl-3-ethylimidazoliumbis(trifluoromethyl)sulfonylimide.

Examples of the basic compounds include pyridine, 4-t-butylpyridine, and benzimidazole.

The hole transport layer may be formed directly on the electron transport layer supporting the photosensitizing compound.

A method for producing the hole transport layer is not particularly limited and may be appropriately selected depending on the intended purpose. Examples of the method include a method for forming a thin film in vacuum, such as vacuum vapor deposition, and a wet film forming method. Of these methods, considering production costs and other factors, the wet film forming method is preferable, and a method for coating the electron transport layer with the hole transport layer is more preferable.

The coating method is not particularly limited and may be appropriately selected depending on the intended purpose. Examples of the coating method include a dipping method, a spraying method, a wire bar method, a spin coating method, a roller coating method, a blade coating method, and a gravure coating method. As wet printing methods, various methods such as letterpress, offset, gravure, intaglio, rubber plate, and screen printing can be used. Film formation may be performed under a supercritical fluid or a subcritical fluid having a temperature/pressure lower than a critical point.

The supercritical fluid is not particularly limited and may be appropriately selected depending on the intended purpose so long as the supercritical fluid exists as a non-condensable high-density fluid in temperature and pressure ranges higher than a limit (critical point) until which a gas and a liquid can coexist, and even when compressed, does not condense but is maintained at higher than or equal to a critical temperature and higher than or equal to a critical pressure. However, a supercritical fluid having a low critical temperature is preferable.

Examples of the supercritical fluid include carbon monoxide, carbon dioxide, ammonia, nitrogen, water, alcohol-based solvents such as methanol, ethanol, and n-butanol, hydrocarbon-based solvents such as ethane, propane, 2,3-dimethylbutane, benzene, and toluene, halogen-based solvents such as methylene chloride and chlorotrifluoromethane, and ether-based solvents such as dimethyl ether. One of these supercritical fluids may be used alone or two or more of these supercritical fluids may be used in combination.

Among these supercritical fluids, carbon dioxide is particularly preferable because carbon dioxide has a critical pressure of 7.3 MPa and a critical temperature of 31 degrees C., and hence can form a supercritical state easily and is incombustible and easy to handle.

The subcritical fluid is not particularly limited and may be appropriately selected depending on the intended purpose so long as the subcritical fluid exists as a high-pressure liquid in temperature and pressure ranges near critical points.

The compounds raised above as examples of the supercritical fluid can also be used favorably as the subcritical fluid.

A critical temperature and a critical pressure of the supercritical fluid are not particularly limited and may be appropriately selected depending on the intended purpose. However, the critical temperature is preferably −273 degrees C. or higher but 300 degrees C. or lower and more preferably 0 degrees C. or higher but 200 degrees C. or lower.

In addition to the supercritical fluid and the subcritical fluid, an organic solvent and an entrainer may further be used in combination. Addition of an organic solvent and an entrainer makes it easier to adjust solubility to the supercritical fluid.

The organic solvent is not particularly limited and may be appropriately selected depending on the intended purpose. Examples of the organic solvent include ketone-based solvents, ester-based solvents, ether-based solvents, amide-based solvents, halogenated hydrocarbon-based solvents, and hydrocarbon-based solvents.

Examples of the ketone-based solvents include acetone, methyl ethyl ketone, and methyl isobutyl ketone.

Examples of the ester-based solvents include ethyl formate, ethyl acetate, and n-butyl acetate.

Examples of the ether-based solvents include diisopropyl ether, dimethoxyethane, tetrahydrofuran, dioxolane, and dioxane.

Examples of the amide-based solvents include N,N-dimethylformamide, N,N-dimethylacetamide, and N-methyl-2-pyrrolidone.

Examples of the halogenated hydrocarbon-based solvents include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon-based solvents include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

In the present disclosure, a press process step may be performed after the hole transport layer is provided over the first electrode over which the electron transport layer coated with the photosensitizing compound is provided.

It is considered that the press process makes close adhesion of the organic hole transport material with the porous electrode stronger to improve efficiency.

A method for the press process is not particularly limited and may be appropriately selected depending on the intended purpose. Examples of the method include a press forming method using a flat plate represented by an IR tablet molding machine, and a roll press method using, for example, a roller.

A pressure is preferably 10 kgf/cm$^2$ or higher and more preferably 30 kgf/cm$^2$ or higher. A time for which the press process is performed is not particularly limited, and is preferably within 1 hour. Heat may be applied during the press process.

In the press process, a release material may be interposed between a press machine and the electrode.

The release material is not particularly limited and may be appropriately selected depending on the intended purpose. Examples of the release material include fluororesins such as polytetrafluoroethylene, polychlorotrifluoroethylene, tetrafluoroethylene-hexafluoropropylene copolymers, perfluoroalkoxy fluoride resins, polyvinylidene fluoride, ethylene-tetrafluoroethylene copolymers, ethylene-chlorotrifluoroethylene copolymers, and polyvinyl fluoride. One of these release materials may be used alone or two or more of these release materials may be used in combination.

After the press process step, a metal oxide layer may be provided between the hole transport layer and the second electrode, before the second electrode is provided.

Examples of the metal oxide layer include molybdenum oxide, tungsten oxide, vanadium oxide, and nickel oxide. Among these metal oxide layers, molybdenum oxide is preferable.

A method for providing the metal oxide layer on the hole transport layer is not particularly limited and may be appropriately selected depending on the intended purpose. Examples of the method include methods for forming a thin film in vacuum, such as sputtering and vacuum vapor deposition, and a wet film forming method.

As the wet film forming method, a method of preparing a paste in which powder or sol of the metal oxide is dispersed, and coating the hole transport layer with the paste is preferable.

In using the wet film forming method, a coating method is not particularly limited and may be performed according to a known method. Examples of the known method include a dipping method, a spraying method, a wire bar method, a spin coating method, a roller coating method, a blade coating method, and a gravure coating method. Moreover, as wet printing methods, various methods such as letterpress, offset, gravure, intaglio, rubber plate, and screen printing may be used.

The average thickness of the metal oxide layer is not particularly limited, may be appropriately selected depending on the intended purpose, and is preferably 0.1 nm or greater but 50 nm or less and more preferably 1 nm or greater but 10 nm or less.

<Second Electrode>

The second electrode is not particularly limited so long as the second electrode is a conductive film having transmissivity to light. Known conductive films used in typical photoelectric conversion elements or, for example, liquid crystal panels may be used.

The transmissivity to light means that transmittance of visible light is 50% or higher and more preferably 70% or higher.

The transmittance of visible light can be measured with, for example, an ultraviolet-visible (UV-vis) spectroscopy method.

Examples of the second electrode include: metals such as platinum, gold, silver, copper, and aluminium, or nanowire of these metals; carbon-based compounds such as graphite, fullerene, carbon nanotube, and graphene; conductive metal oxides such as indium tin oxide, fluorine-doped tin oxide, and antimony-doped tin oxide; conductive polymers such as polythiophene and polyaniline; and PEDOT/PSS. One of these materials may be used alone or two or more of these materials may be used in combination.

Among these materials, polythiophene, PEDOT/PSS, and metal nanowire are preferable.

With a metal wire of, for example, silver dispersed, a low electric resistance can be obtained while transmissivity to light is maintained.

With a view to lowering a resistance, for example, a metal lead line may be used in combination. Examples of the material of the metal lead line include metals such as aluminium, copper, silver, gold, platinum, and nickel. The metal lead line can be formed on the second electrode film by, for example, screen printing and vapor deposition.

The thickness of the second electrode layer is not particularly limited. The second electrode needs to have transmissivity to light, and may use a single material or a mixture of 2 or more materials.

The second electrode is formed on the hole transport layer.

Formation of the second electrode by coating can be performed by appropriate methods such as coating, lamination, vapor deposition, CVD, and pasting on the hole transport layer, depending on the kind of the material used and the kind of the hole transport layer.

In order to operate as a dye-sensitized solar cell, at least one of the first electrode and the second electrode needs to be substantially transparent (transmissive to light). In the present disclosure, the second electrode side is transparent. A preferable manner is that sunlight is made incident from the second electrode side. In this case, it is preferable to use a light-reflecting material at the first electrode side. Metals, glass on which a conductive oxide is vapor-deposited, plastics, and metallic thin films are preferable.

Providing an antireflection layer at a sunlight incident side is also an effective means.

The configuration of the photoelectric conversion element will be described with reference to FIG. 1. FIG. 1 is an example of a cross-sectional view of a photoelectric conversion element and a solar cell.

The embodiment illustrated in FIG. 1 is a configuration example in which a first electrode 2 is formed on a substrate 1, a hole blocking layer 3 is formed on the first electrode 2, an electron transport layer 4 is formed on the hole blocking layer 3, a photosensitizing compound 5 is adsorbed to the electron transport material in the electron transport layer 4, and a hole transport layer 6 is interposed between the first electrode 2 and a second electrode 7 counter to the first electrode 2. The configuration example illustrated in FIG. 1 also includes lead lines 8 and 9 provided in a manner to make the first electrode 2 and the second electrode 7 electrically continuous. Note that no substrate 1 is needed when the first electrode 2 has hardness.

<Applications>

In the present disclosure, the photoelectric conversion element refers to an element configured to convert light energy to electric energy or an element configured to convert electric energy to light energy. Specific examples of the photoelectric conversion element include a solar cell and a photodiode.

The photoelectric conversion element of the present disclosure can be applied to a power supply device when combined with, for example, a circuit board configured to control a generated current. Examples of devices utilizing the power supply device include a desk-top electronic calculator and a wristwatch. In addition, the power supply device including the photoelectric conversion element of the present disclosure can be applied to, for example, a portable phone, an electronic organizer, and an electronic paper. The power supply device including the photoelectric conversion element of the present disclosure can also be used as an auxiliary power supply intended for extending a continuously usable time of chargeable or dry cell-operated electric appliances.

EXAMPLES

Examples of the present disclosure will be described below. However, the present disclosure should not be construed as being limited to the Examples.

In Examples and Comparative Examples below, being transmissive to light means that transmittance of visible light is 50% or higher, and being opaque to light means that transmittance of visible light is lower than 50%.

The transmittance of visible light was measured with V-660DS (available from Jasco Corporation), which was an ultraviolet-visible (UV-vis) spectrometer.

Example 1

<Production of Titanium Oxide Semiconductor Electrode>

As a first electrode, a titanium foil (opaque) having a thickness of 50 micrometers was subjected to a heating treatment in a firing furnace (available from Furutech Co., Ltd., FTM-1300G-400) in an oxygen atmosphere at 750 degrees C. for 30 minutes, to obtain a first electrode on whose surface a dense hole blocking layer formed of titanium oxide was formed.

Next, titanium oxide (available from Nippon Aerosil Co., Ltd., P90) (3 g), acetylacetone (0.2 g), and a surfactant (available from Wako Pure Chemical Industries, Ltd., polyoxyethylene octylphenyl ether) (0.3 g) were subjected to a bead mill treatment for 12 hours together with water (5.5 g) and ethanol (1.0 g), to obtain a titanium oxide dispersion liquid.

Polyethylene glycol (#20,000, available from Wako Pure Chemical Industries, Ltd.) (1.2 g) was added to the obtained titanium oxide dispersion liquid, to produce a paste.

The obtained paste was coated on the hole blocking layer to have an average thickness of 1.5 micrometers, dried at room temperature, and then fired in the air at 500 degrees C. for 30 minutes, to form a porous electron transport layer. In the way described above, a titanium oxide semiconductor electrode was produced.

<Production of Dye-Sensitized Solar Cell>

The titanium oxide semiconductor electrode was immersed in a sensitizing dye, which was D358 available from Mitsubishi Paper Mills Limited and represented by structural formula (4) below (0.5 mM, an acetonitrile/t-butanol (at a volume ratio of 1:1) solution), and left to stand still for 1 hour in a dark place, to adsorb the photosensitizing compound.

<Structural formula (4)>

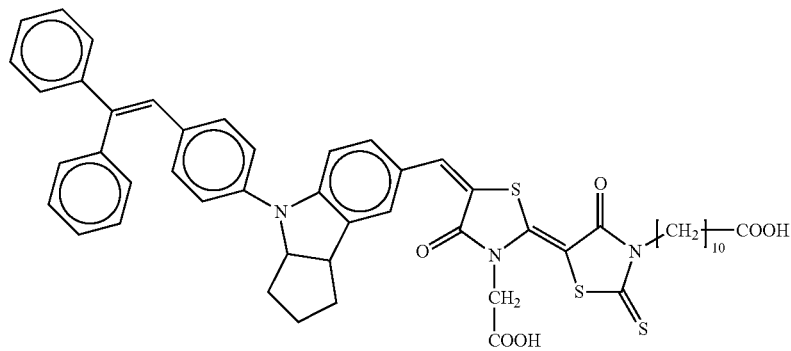

Next, lithium bis(trifluoromethanesulfonyl)imide (with a solid content of 1% by mass, available from Kanto Chemical Co., Inc.) (12.83 mg) and an exemplary basic compound No. 2-1 represented by a structural formula below (with a solid content of 1.4% by mass) (18.3 mg) were added to a chlorobenzene solution (with a solid content of 14% by mass) (1.28 g) of a hole transport material (available from Luminescence Technology Corp., name: N,N,N',N'-tetrakis(4-methoxyphenyl)benzidine, product number: LT-N212), to prepare a hole transport layer coating liquid.

<Compound No. 2-1>

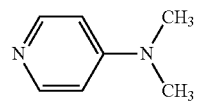

Next, the hole transport layer coating liquid was spin-coated on the semiconductor electrode supporting the photosensitizing compound, to form a hole transport layer.

Next, a film of a paste (transmissive) of PEDOT/PSS (available from Sigma-Aldrich Co., LLC, ORGACON™ EL-P-5015) was formed on the hole transport layer by screen printing, and heated and dried at 100 degrees C. for 30 minutes, to form a second electrode. In the way described above, a dye-sensitized solar cell was produced.

<Evaluation of Dye-Sensitized Solar Cell>

An open circuit voltage, a short-circuiting current density, and a photoelectric conversion efficiency of the obtained dye-sensitized solar cell under white LED irradiation (300 Lux: 75 microwatts/cm², 100 Lux: 25 microwatts/cm², and 50 Lux: 12.5 watts/cm²) were measured. The results are presented in Table 1-1 to Table 1-3.

The measurement was performed using a desk lamp CDS-90α (study mode) available from Cosmotechno. Co., Ltd. as the white LED, and a solar cell evaluation system AS-510-PV03 available from NF Corporation as an evaluator.

Example 2

A solar cell was produced in the same manner as in Example 1, except that unlike in Example 1, N,N,N',N'-tetrakis(4-methoxyphenyl)benzidine, which was the hole transport material, was changed to spiro-OMeTAD represented by structural formula (1) (available from Merck KGaA, name: 2,2',7,7'-tetrakis(N,N-di-p-methoxyphenylamino)-9,9'-spirobifluorene, product number: SHT-263). An open circuit voltage, a short-circuiting current density, and a photoelectric conversion efficiency were measured in the same manner as in Example 1. The results are presented in Table 1-1 to Table 1-3.

Example 3

A solar cell was produced in the same manner as in Example 2, except that unlike in Example 2, the titanium foil as the first electrode was changed to a metal foil (opaque) having a three-layer structure formed of titanium (with a thickness of 20 micrometers)/stainless steel (with a thickness of 60 micrometers)/titanium (with a thickness of 20 micrometers). An open circuit voltage, a short-circuiting current density, and a photoelectric conversion efficiency were measured in the same manner as in Example 1. The results are presented in Table 1-1 to Table 1-3.

Example 4

A solar cell was produced in the same manner as in Example 2, except that unlike in Example 2, PEDOT/PSS as the second electrode was changed to a coating liquid (transmissive) of silver nanowire (available from Sigma-Aldrich Co., LLC, product number: 730777). An open circuit voltage, a short-circuiting current density, and a photoelectric conversion efficiency were measured in the same manner as in Example 1. The results are presented in Table 1-1 to Table 1-3.

Example 5

A solar cell was produced in the same manner as in Example 2, except that unlike in Example 2, lithium bis (trifluoromethanesulfonyl)imide for the hole transport layer was changed to 1-n-hexyl-3-methyl imidazolinium bis(trifluoromethylsulfonyl)imide. An open circuit voltage, a short-circuiting current density, and a photoelectric conversion efficiency were measured in the same manner as in Example 1. The results are presented in Table 1-1 to Table 1-3.

Example 6

A solar cell was produced in the same manner as in Example 2, except that unlike in Example 2, the exemplary basic compound No. 2-1 was changed to an exemplary basic compound No. 2-3 represented by a structural formula below. An open circuit voltage, a short-circuiting current density, and a photoelectric conversion efficiency were measured in the same manner as in Example 1. The results are presented in Table 1-1 to Table 1-3.

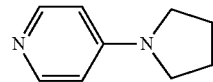

<Compound No. 2-3>

Example 7

<Production of Titanium Oxide Semiconductor Electrode>

By a reactive sputter method by an oxygen gas using a target formed of metal titanium, a first electrode formed of titanium (opaque) and having a thickness of 100 μm and a dense hole blocking layer formed of titanium oxide and having a thickness of 10 nm were formed on a glass substrate.

Next, titanium oxide (available from Nippon Aerosil Co., Ltd., P90) (3 g), acetylacetone (0.2 g), and a surfactant (available from Wako Pure Chemical Industries, Ltd., polyoxyethylene octylphenyl ether) (0.3 g) were subjected to a bead mill treatment for 12 hours together with water (5.5 g) and ethanol (1.0 g).

Polyethylene glycol (#20,000, available from Wako Pure Chemical Industries, Ltd.) (1.2 g) was added to the obtained dispersion liquid, to produce a paste.

The obtained paste was coated on the hole blocking layer to have a thickness of 1.5 micrometers, dried at room temperature, and fired in the air at 500 degrees C. for 30 minutes, to form a porous electron transport layer. In the way described above, a titanium oxide semiconductor electrode was produced.

<Production of Dye-Sensitized Solar Cell>

The titanium oxide semiconductor electrode was immersed in a sensitizing dye, which was D358 available from Mitsubishi Paper Mills Limited and represented by structural formula (4) below (0.5 mM, an acetonitrile/t-butanol (at a volume ratio of 1:1) solution), and left to stand still for 1 hour in a dark place, to adsorb the photosensitizing compound.

<Structural formula (4)>

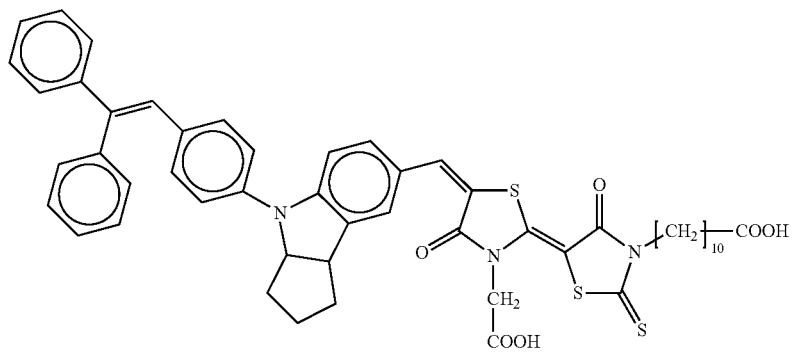

Next, lithium bis(trifluoromethanesulfonyl)imide (with a solid content of 1% by mass, available from Kanto Chemical Co., Inc.) (12.83 mg) and an exemplary basic compound No. 2-1 represented by a structural formula below (with a solid content of 1.4% by mass) (18.3 mg) were added to a chlorobenzene solution (with a solid content of 14% by mass) (1.28 g) of a hole transport material, which was spiro-OMeTAD represented by structural formula (1) (available from Merck KGaA, name: 2,2',7,7'-tetrakis(N,N-di-p-methoxyphenylamino)-9,9'-spirobifluorene, product number: SHT-263), to prepare a hole transport layer coating liquid.

<Compound No. 2-1>

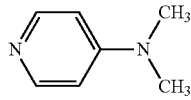

Next, the hole transport layer coating liquid was spin-coated on the semiconductor electrode supporting the photosensitizing compound, to form a hole transport layer.

Next, a film of a paste (transmissive) of PEDOT/PSS (available from Sigma-Aldrich Co., LLC, ORGACON™ EL-P-5015) was formed on the hole transport layer by screen printing, and heated and dried at 100 degrees C. for 30 minutes, to produce a second electrode, to produce a dye-sensitized solar cell was produced.

An open circuit voltage, a short-circuiting current density, and a photoelectric conversion efficiency of the obtained dye-sensitized solar cell were measured in the same manner as in Example 1. The results are presented in Table 1-1 to Table 1-3.

Comparative Example 1

A solar cell was produced in the same manner as in Example 1, except that unlike in Example 1, the titanium foil (opaque) as the first electrode and the hole blocking layer formed of titanium oxide formed on the titanium foil were changed to an ITO-based glass substrate (transmissive) and a dense hole blocking layer of titanium oxide formed on the ITO-based glass substrate by a reactive sputter method by an oxygen gas using a target formed of metal titanium. An open circuit voltage, a short-circuiting current density, and a photoelectric conversion efficiency were measured in the same manner as in Example 1. The results are presented in Table 1-1 to Table 1-3.

Comparative Example 2

A solar cell was produced in the same manner as in Example 1, except that unlike in Example 1, the titanium foil as the first electrode was changed to a stainless steel foil (opaque), and a hole blocking layer formed of titanium oxide was formed on the stainless steel foil by a reactive sputter method by an oxygen gas using a target formed of metal titanium. An open circuit voltage, a short-circuiting current density, and a photoelectric conversion efficiency were measured in the same manner as in Example 1. The results are presented in Table 1-1 to Table 1-3.

Comparative Example 3

A solar cell was produced in the same manner as in Example 2, except that unlike in Example 2, the titanium foil (opaque) as the first electrode and the hole blocking layer formed of titanium oxide formed on the titanium foil were changed to an ITO-based glass substrate (transmissive) and a dense hole blocking layer formed of titanium oxide formed on the ITO-based glass substrate by a reactive sputter method by an oxygen gas using a target formed of metal titanium. An open circuit voltage, a short-circuiting current density, and a photoelectric conversion efficiency were measured in the same manner as in Example 1. The results are presented in Table 1-1 to Table 1-3.

Comparative Example 4

A solar cell was produced in the same manner as in Example 2, except that unlike in Example 2, the titanium foil as the first electrode was changed to a stainless steel foil (opaque), and a hole blocking layer formed of titanium oxide was formed on the stainless steel foil by a reactive sputter method by an oxygen gas using a target formed of metal titanium. An open circuit voltage, a short-circuiting current density, and a photoelectric conversion efficiency were measured in the same manner as in Example 1. The results are presented in Table 1-1 to Table 1-3.

Comparative Example 5

A solar cell was produced in the same manner as in Example 2, except that unlike in Example 2, PEDOT/PSS as the second electrode was changed to a silver film (opaque) having an average thickness of 100 nm by vacuum vapor deposition. An open circuit voltage, a short-circuiting current density, and a photoelectric conversion efficiency were measured in the same manner as in Example 1. The results are presented in Table 1-1 to Table 1-3.

TABLE 1-1

| | 300 Lux (75 microwatts/cm$^2$) | | |
|---|---|---|---|
| | Open circuit voltage (V) | Short-circuiting current density (microampere/cm$^2$) | Photoelectric conversion efficiency (%) |
| Ex. 1 | 0.791 | 15.09 | 10.98 |
| Ex. 2 | 0.855 | 21.58 | 18.94 |
| Ex. 3 | 0.851 | 21.47 | 18.27 |
| Ex. 4 | 0.849 | 21.87 | 19.56 |
| Ex. 5 | 0.831 | 21.83 | 18.62 |
| Ex. 6 | 0.857 | 21.68 | 19.08 |
| Ex. 7 | 0.848 | 21.49 | 18.47 |
| Comp. Ex. 1 | 0.795 | 12.53 | 8.63 |
| Comp. Ex. 2 | 0.794 | 9.87 | 6.79 |
| Comp. Ex. 3 | 0.854 | 17.32 | 15.19 |
| Comp. Ex. 4 | 0.849 | 12.91 | 11.25 |
| Comp. Ex. 5 | | Unmeasurable | |

TABLE 1-2

| | 100 Lux (25 microwatts/cm$^2$) | | |
|---|---|---|---|
| | Open circuit voltage (V) | Short-circuiting current density (microampere/cm$^2$) | Photoelectric conversion efficiency (%) |
| Ex. 1 | 0.771 | 5.03 | 11.01 |
| Ex. 2 | 0.839 | 7.21 | 19.12 |
| Ex. 3 | 0.831 | 7.19 | 18.40 |
| Ex. 4 | 0.829 | 7.21 | 18.89 |
| Ex. 5 | 0.819 | 7.22 | 17.50 |
| Ex. 6 | 0.840 | 7.25 | 19.24 |
| Ex. 7 | 0.832 | 7.11 | 18.22 |
| Comp. Ex. 1 | 0.769 | 4.17 | 9.12 |
| Comp. Ex. 2 | 0.767 | 3.29 | 7.17 |
| Comp. Ex. 3 | 0.838 | 5.72 | 15.15 |
| Comp. Ex. 4 | 0.831 | 4.29 | 11.27 |
| Comp. Ex. 5 | | Unmeasurable | |

TABLE 1-3

| | 50 Lux (12.5 microwatts/cm$^2$) | | |
|---|---|---|---|
| | Open circuit voltage (V) | Short-circuiting current density (microampere/cm$^2$) | Photoelectric conversion efficiency (%) |
| Ex. 1 | 0.758 | 2.51 | 10.81 |
| Ex. 2 | 0.825 | 3.62 | 18.87 |
| Ex. 3 | 0.821 | 3.58 | 18.11 |
| Ex. 4 | 0.819 | 3.61 | 18.69 |
| Ex. 5 | 0.805 | 3.42 | 16.30 |
| Ex. 6 | 0.826 | 3.63 | 18.95 |
| Ex. 7 | 0.821 | 3.58 | 17.16 |
| Comp. Ex. 1 | 0.754 | 2.07 | 8.94 |
| Comp. Ex. 2 | 0.752 | 1.65 | 7.03 |
| Comp. Ex. 3 | 0.825 | 2.87 | 14.96 |
| Comp. Ex. 4 | 0.826 | 2.18 | 10.23 |
| Comp. Ex. 5 | | Unmeasurable | |

From the results of Table 1-1 to Table 1-3, Comparative Example 1 using the first electrode and second electrode having transmissivity to light, to result in a low light trapping effect, was lower than Example 1 in the short-circuiting current density and the photoelectric conversion efficiency.

Comparative Example 2 using different kinds of metals in the first electrode and the hole blocking layer, to result in a poor electron injection characteristic, was lower than Example 1 in the short-circuit current density and the photoelectric conversion efficiency.

Comparative Example 3 using the first electrode and second electrode having transmissivity to light, to result in a low light trapping effect, was lower than Example 2 in the short-circuiting current density.

Comparative Example 4 using different kinds of metals in the first electrode and the hole blocking layer, to result in a poor electron injection characteristic, was lower than Example 2 in the short-circuiting current density.

Comparative Example 5 using the second electrode opaque to light, to result in impossibility for light to reach the power generating layer, had no photoelectric conversion characteristic at all (unmeasurable).

As compared, the solar cells of Examples 1 to 7 all had an excellent photoelectric conversion efficiency. Among these Examples, Examples 2 to 7 using spiro-OMeTAD represented by structural formula (1) as the hole transport material achieved a particularly high photoelectric conversion efficiency.

As described above, it turned out that the photoelectric conversion element of the present disclosure was able to obtain a good photoelectric conversion performance even under weak irradiation light (from 50 Lux through 300 Lux) such as room light.

Aspects of the present disclosure are as follows, for example.

<1> A photoelectric conversion element including:

a first electrode having opaqueness to light and formed of a metal;

a hole blocking layer provided on the first electrode;

an electron transport layer provided on the hole blocking layer;

a hole transport layer provided on the electron transport layer; and a second electrode provided on the hole transport layer and having transmissivity to light, wherein the hole blocking layer contains an oxide of the metal in the first electrode.

<2> The photoelectric conversion element according to <1>, wherein the oxide of the metal in the hole blocking layer is obtained by subjecting the first electrode to a heating treatment in an oxygen atmosphere.

<3> The photoelectric conversion element according to <1>, wherein the oxide of the metal in the hole blocking layer is obtained by a reactive sputter method by an oxygen gas using a target formed of the metal.

<4> The photoelectric conversion element according to any one of <1> to <3>, wherein the oxide of the metal in the hole blocking layer is titanium oxide.

<5> The photoelectric conversion element according to any one of <1> to <4>, wherein the hole transport layer contains a hole transport material represented by structural formula (1) below, <Structural formula (1)>

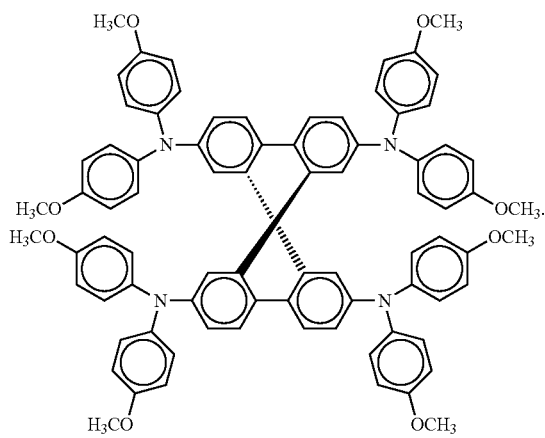

<6> The photoelectric conversion element according to any one of <1> to <5>,
wherein the first electrode contains at least one metal selected from the group consisting of stainless steel, copper, titanium, and aluminium.
<7> The photoelectric conversion element according to any one of <1> to <6>,
wherein the second electrode contains at least one selected from the group consisting of polythiophene and metal nanowire.
<8> The photoelectric conversion element according to any one of <1> to <7>,
wherein the hole transport layer contains lithium bis(trifluoromethanesulfonyl)imide.
<9> The photoelectric conversion element according to any one of <1> to <8>,
wherein a photoelectric conversion efficiency of the photoelectric conversion element under irradiation with a white LED of 100 Lux is 11% or higher.
<10> The photoelectric conversion element according to any one of <1> to <9>,
wherein the photoelectric conversion element is used in an environment under weak light of from 50 Lux through 300 Lux.
<11> The photoelectric conversion element according to any one of <1> to <10>,
wherein an average thickness of the hole blocking layer is 10 nm or greater but 1 micrometer or less.
<12> The photoelectric conversion element according to any one of <1> to <11>,
wherein the first electrode contains titanium.
<13> The photoelectric conversion element according to any one of <1> to <12>,
wherein the hole transport layer contains a basic compound represented by general formula (1) below, <General formula (1)>

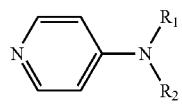

where in general formula (1), $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group containing a nitrogen atom.
<14> The photoelectric conversion element according to any one of <1> to <13>,
wherein the basic compound represented by general formula (1) is a basic compound represented by any one of structural formulae below,

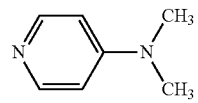
<Compound No. 2-1>

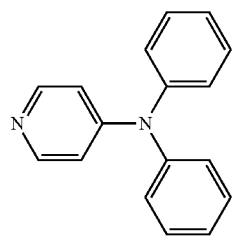
<Compound No. 2-2>

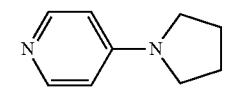
<Compound No. 2-3>

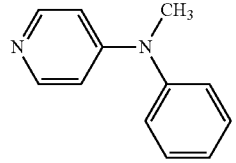
<Compound No. 2-4>

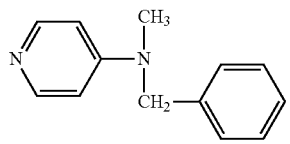
<Compound No. 2-5>

<15> The photoelectric conversion element according to any one of <1> to <14>,
wherein the electron transport layer contains an electron transport material to which a photosensitizing compound represented by general formula (2) below is adsorbed, <General formula (2)>

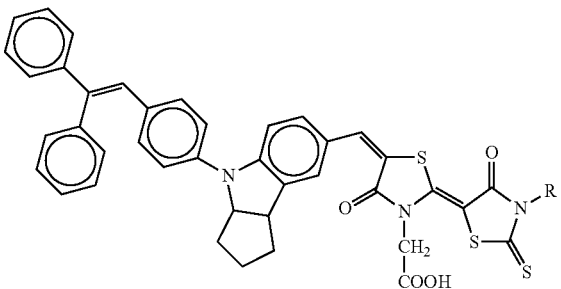

where in general formula (2), R represents a substituted or unsubstituted alkyl group.

<16> The photoelectric conversion element according to any one of <1> to <15>,
wherein the electron transport material is at least one selected from the group consisting of titanium oxide, zinc oxide, tin oxide, and niobium oxide.
<17> The photoelectric conversion element according to any one of <1> to <16>,
wherein the hole transport layer contains an ionic liquid.
<18> The photoelectric conversion element according to any one of <1> to <17>, including
a metal oxide layer between the hole transport layer and the second electrode.
<19> The photoelectric conversion element according to any one of <7> to <18>,
wherein the metal nanowire is silver nanowire.
<20> The photoelectric conversion element according to any one of <1> to <19>,
wherein the transmissivity to light means that transmittance of visible light is 50% or higher, and the opaqueness to light means that transmittance of visible light is lower than 50%.

The photoelectric conversion element according to any one of <1> to <20> aims for solving the various problems in the related art and achieving the object described below. That is, the photoelectric conversion element has an object to provide a photoelectric conversion element capable of achieving a good photoelectric conversion performance even under weak irradiation light (from 50 Lux through 300 Lux) such as room light.

What is claimed is:

1. A photoelectric conversion element comprising:
a first electrode having opaqueness to light and formed of a metal;
a hole blocking layer provided on the first electrode;
an electron transport layer provided on the hole blocking layer;
a hole transport layer provided on the electron transport layer; and
a second electrode provided on the hole transport layer and having transmissivity to light,
wherein
the hole blocking layer comprises an oxide of the metal in the first electrode, and the hole transport layer comprises a basic compound of formula (1):

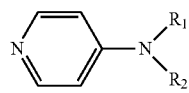

wherein $R_1$ and $R_2$ represent a substituted or unsubstituted alkyl group or aromatic hydrocarbon group and may be identical or different, and $R_1$ and $R_2$ may bind with each other to form a substituted or unsubstituted heterocyclic group comprising a nitrogen atom.

2. The photoelectric conversion element according to claim 1, wherein the oxide of the metal in the hole blocking layer is obtained by subjecting the first electrode to a heating treatment in an oxygen atmosphere.
3. The photoelectric conversion element according to claim 1, wherein the oxide of the metal in the hole blocking layer is obtained by a reactive sputter method by an oxygen gas using a target formed of the metal.
4. The photoelectric conversion element according to claim 1, wherein the oxide of the metal in the hole blocking layer comprises titanium oxide.
5. The photoelectric conversion element according to claim 1, wherein the hole transport layer comprises a hole transport material represented by structural formula (1) below, <Structural formula (1)>

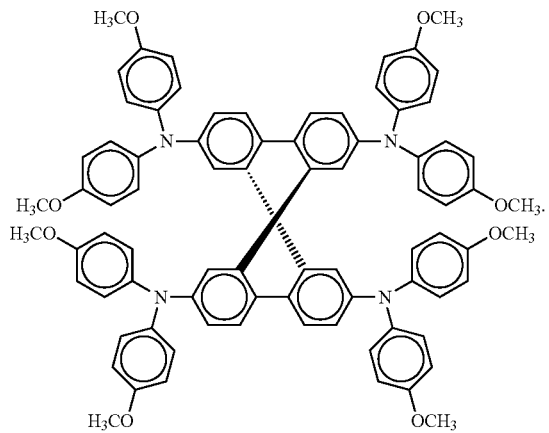

6. The photoelectric conversion element according to claim 1, wherein the first electrode comprises at least one metal selected from the group consisting of stainless steel, copper, titanium, and aluminium.
7. The photoelectric conversion element according to claim 1, wherein the second electrode comprises at least one selected from the group consisting of polythiophene and metal nanowire.
8. The photoelectric conversion element according to claim 1, wherein the hole transport layer comprises lithium bis(trifluoromethanesulfonyl)imide.
9. The photoelectric conversion element according to claim 1, wherein the photoelectric conversion element is used in an environment under weak light of from 50 Lux through 300 Lux.
10. The photoelectric conversion element according to claim 1, wherein the first electrode is a layer directly on a substrate, wherein the substrate is selected from the group consisting of a glass plate, a transparent plastic plate, a transparent plastic film, and an inorganic transparent crystal.

* * * * *